(12) United States Patent
Torii et al.

(10) Patent No.: US 7,800,913 B2
(45) Date of Patent: Sep. 21, 2010

(54) WIRING BOARD AND SEMICONDUCTOR DEVICE USING THE SAME

(75) Inventors: Michiharu Torii, Shiga (JP); Kouichi Nagao, Kyoto (JP); Nozomi Shimoishizaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 896 days.

(21) Appl. No.: 11/539,706

(22) Filed: Oct. 9, 2006

(65) Prior Publication Data
US 2007/0109759 A1 May 17, 2007

(30) Foreign Application Priority Data
Nov. 17, 2005 (JP) .............................. 2005-333004

(51) Int. Cl.
*H05K 1/00* (2006.01)
(52) U.S. Cl. ...................................... 361/749
(58) Field of Classification Search ................. 361/749, 361/777, 780; 257/727–730, 784
See application file for complete search history.

(56) References Cited

U.S. PATENT DOCUMENTS

| | | | | |
|---|---|---|---|---|
| 5,118,370 A | * | 6/1992 | Ozawa | 156/73.1 |
| 5,825,081 A | * | 10/1998 | Hosomi et al. | 257/668 |
| 6,040,621 A | * | 3/2000 | Nose | 257/666 |
| 6,268,644 B1 | | 7/2001 | Umehara et al. | |
| 7,250,575 B2 | * | 7/2007 | Nagao et al. | 174/254 |
| 2004/0212969 A1 | | 10/2004 | Imamura et al. | |

FOREIGN PATENT DOCUMENTS

JP        2004-327936        11/2004

* cited by examiner

*Primary Examiner*—Jinhee J Lee
*Assistant Examiner*—Abiy Getachew
(74) *Attorney, Agent, or Firm*—Hamre, Schumann, Mueller & Larson, P.C.

(57) ABSTRACT

A wiring board includes: a flexible insulating base; a plurality of conductive wirings arranged on the insulating base, end portions of the conductive wirings defining inner leads at a region where a semiconductor chip is to be mounted; and bump electrodes that are provided respectively at the inner leads of the conductive wirings. The wiring board further includes: dummy inner leads having a shape and a pitch corresponding to a shape and a pitch of the inner leads and aligned with the inner leads, the dummy inner leads being provided with dummy bump electrodes corresponding to the bump electrodes; a trunk conductive wiring provided for a group of one or an adjacent plurality of the dummy inner leads; and a branch wiring branching off from the trunk conductive wiring, the branch wiring being connected with the dummy inner leads belonging to the group corresponding to the trunk conductive wiring. Stress concentration on the inner leads during packaging of the semiconductor chip, resulting from the sparse arrangement of the electrode pads of the semiconductor chip, can be alleviated, thus suppressing a break in the inner leads.

8 Claims, 5 Drawing Sheets

WIRING BOARD AND SEMICONDUCTOR DEVICE USING THE SAME

BACKGROUND OF THE INVENTION

1. Field of the Invention

The present invention relates to a wiring board such as a tape carrier substrate including a flexible insulating base with conductive wirings arranged thereon, on each of which a bump electrode for connection with a semiconductor chip is formed. The present invention also relates to a semiconductor device using the wiring board.

2. Description of Related Art

A package module using a tape carrier substrate is known as a Chip On Film (COF), for example. The main constituents of a tape carrier substrate include a flexible insulating film base and a large number of conductive wirings formed on the film base. A COF is manufactured by mounting a semiconductor chip on such a tape carrier substrate and connecting electrode pads of the semiconductor chip with the conductive wirings to package the semiconductor chip.

JP2004-327936 A describes a configuration of bump electrodes being formed at a region of end portions, i.e., at inner leads of conductive wirings on a tape carrier substrate where a semiconductor chip is to be mounted. The connection of the conductive wirings of the tape carrier substrate with electrode pads of the semiconductor chip via bump electrodes can enhance the connection reliability for the semiconductor chip packaging. In general, polyimide is used as the film base, and copper is used as the conductive wirings and the bump electrodes. A metal plated coating optionally is formed at a predetermined area of the conductive wirings.

The COF mainly is used for packaging of a driver for driving a display panel such as a liquid crystal panel. FIG. 5 shows an exemplary tape carrier substrate used for the packaging of a driver for driving a display panel. FIG. 6 is a cross-sectional view of this tape carrier substrate on which a semiconductor chip is packaged.

In FIG. 5, reference numeral 1 denotes a flexible insulating base. A semiconductor chip 2 and electrode pads 3 provided for the semiconductor chip 2 are shown with broken lines. At a region on the insulating base 1 where the semiconductor chip 2 is to be mounted, inner leads 4a to 4d are disposed. The inner leads 4a to 4d are a part of conductive wirings provided on the insulating base 1, and the other ends of the inner leads form external terminals (not illustrated). At end portions of the inner leads 4a to 4d, bump electrodes 5 are provided respectively. As shown in FIG. 6, the bump electrodes 5 are disposed so as to face the electrode pads 3 of the semiconductor chip 2 respectively, and the electrode pads 3 and the inner leads 4a to 4d are connected via the bump electrodes 5. A bonding portion of the inner leads 4a to 4d and the semiconductor chip 2 is sealed with a protective resin 14.

In general, in the case where such a tape carrier substrate, which is for making up a dual in-line package in two ways of input and output, is used for example as a driver for driving a display panel, the number of input terminals is much different from the number of output terminals. In FIG. 5, the inner leads 4a and 4b are on the output side, and the inner leads 4c and 4d are on the input side. For instance, there are 60 to 80 terminals on the input side, whereas there are 400 to 800 terminals aligned on the output side.

When the semiconductor chip 2 is packaged on this tape carrier substrate, as shown in FIG. 7, after the tape carrier substrate is placed on a bonding stage 10 and the semiconductor chip 2 is held with a bonding tool 11, face-down bonding is conducted. Pressure and heat (about 250° C.) are applied by the bonding tool 11 while ultrasonic vibration is applied in the direction of the arrow X, whereby the bump electrodes 5 and the electrode pads of the semiconductor chip 2 are bonded.

When a semiconductor chip is packaged on a tape carrier substrate by face-down bonding as described above, stress will be concentrated at the interface between the inner leads and the bump electrodes, as pressure, heat and ultrasonic wave are applied thereto. Therefore, a break tends to occur in the inner leads. Such stress particularly tends to be concentrated at the interface between an inner lead and a bump electrode when the inner lead is located at an end portion of the semiconductor chip or the inner leads are arranged sparsely, thus increasing the tendency of a break in the inner leads.

The inner leads in FIG. 5 can be divided into the inner leads 4a at a center portion 12a on the output side, the inner leads 4b at an end portion 12b on the output side, the inner leads 4c at a center portion 13a on the input side and the inner leads 4d at an end portion 13b on the input side.

A wiring density is higher at the center portion 12a on the output side, where the inner leads 4a are arranged with a uniform pitch. The inner leads 4b at the end portion 12b on the output side and the inner leads 4d at the end portion 13b on the input side are formed thicker than the inner leads 4a. This is because the inner leads located at an end portion of the semiconductor chip tend to have stress concentrated on the interface between the inner leads and the bump electrodes, and therefore they are made thicker for suppressing a break in the inner leads.

Since the electrode pads of the semiconductor chip are arranged sparsely at the center portion 13a on the input side as described above, the wiring density of the corresponding inner leads 4c accordingly is low, and therefore the inner leads 4c are not arranged uniformly. Thus, there is a conspicuous tendency toward breaking of inner leads at a portion of the inner leads arranged sparsely, because stress is concentrated when pressure, temperature and ultrasonic vibration are applied for packaging the semiconductor chip on the tape carrier substrate.

SUMMARY OF THE INVENTION

Therefore, with the foregoing in mind, it is an object of the present invention to provide a wiring board having a structure that can alleviate the stress concentration on inner leads that occurs during the packaging of a semiconductor chip, so that a break in the inner leads can be suppressed. Such stress concentration is apt to occur when electrode pads of the semiconductor chip are arranged sparsely due to the arrangement of bump electrodes at the corresponding inner leads.

A wiring board of the present invention includes: a flexible insulating base; a plurality of conductive wirings arranged on the insulating base, end portions of the conductive wirings at a region where a semiconductor chip is to be mounted defining inner leads; and bump electrodes that are provided respectively at the inner leads of the conductive wirings. In order to attain the above-mentioned object, the wiring board further includes: dummy inner leads having a shape and a pitch corresponding to a shape and a pitch of the inner leads and aligned with the inner leads, the dummy inner leads being provided with dummy bump electrodes corresponding to the bump electrodes; a trunk conductive wiring provided for a group of one or an adjacent plurality of the dummy inner leads; and a branch wiring branching off from the trunk conductive wiring, the branch wiring being connected with the dummy inner leads belonging to the group corresponding to the trunk conductive wiring.

These and other advantages of the present invention will become apparent to those skilled in the art upon reading and understanding the following detailed description with reference to the accompanying figures.

DETAILED DESCRIPTION OF THE INVENTION

Figure 1:
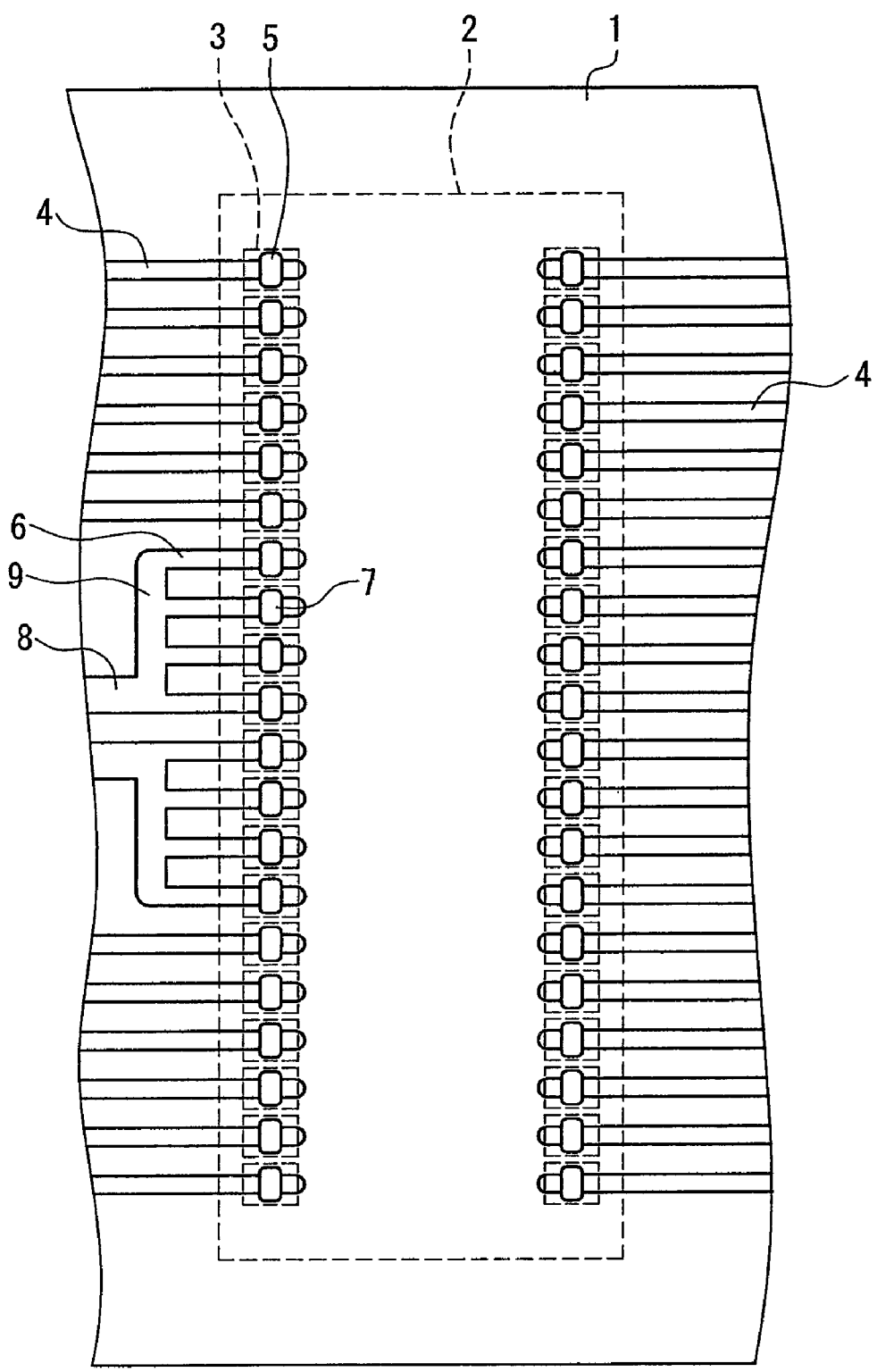
FIG. 1 is a plan view of a wiring board of Embodiment 1.

A wiring board of the present invention includes: a flexible insulating base; a plurality of conductive wirings arranged on the insulating base, end portions of the conductive wirings defining inner leads at a region where a semiconductor chip is to be mounted; and bump electrodes that are provided respectively at the inner leads of the conductive wirings. The wiring board further includes: dummy inner leads having a shape and a pitch corresponding to a shape and a pitch of the inner leads and aligned with the inner leads, the dummy inner leads being provided with dummy bump electrodes corresponding to the bump electrodes; a trunk conductive wiring provided for a group of one or an adjacent plurality of the dummy inner leads; and a branch wiring branching off from the trunk conductive wiring, the branch wiring being connected with the dummy inner leads belonging to the group corresponding to the trunk conductive wiring.

With the thus configured wiring board, even when electrode pads of a semiconductor chip are arranged sparsely in some portions, inner leads and bump electrodes at a corresponding region can be arranged with a uniform and dense pitch as a whole. Thereby, the stress concentration on inner leads during the packaging of a semiconductor chip, resulting from the sparse arrangement, can be alleviated, thus suppressing a break in the inner leads.

In the above wiring board, it is preferable that a wiring width Wa of the trunk conductive wiring, the number n of the dummy inner leads connected with the trunk conductive wiring and a wiring width Wc of the dummy inner leads establish the relationship of the following inequalities (1):

$$Wa \geq Wc \times n/4$$

where Wa>Wc. (1)

Further, it is preferable that a wiring width Wb of the branch wiring, the number n of the dummy inner leads connected with the branch wiring and a wiring width Wc of the dummy inner leads establish the relationship of the following inequalities (2):

$$Wb \geq Wc \times n/3$$

where Wb>Wc. (2)

In any one of the above-stated configurations, it is preferable that a wiring width Wa of the trunk conductive wiring, a wiring width Wb of the branch wiring branching off from the trunk conductive wiring and a wiring width Wc of the dummy inner leads connected with the branch wiring establish the relationship of the following inequality (3):

$$Wa > Wb \geq Wc.$$ (3)

In any one of the above-stated configurations, it is preferable that assuming that a minimum wiring width, a maximum wiring width and a minimum pitch of the inner leads and the dummy inner leads that are disposed along one side of the semiconductor chip are Wmin, Wmax and Pmin, respectively, dimensions thereof are set so that the relationship of the following inequalities (4) can be established:

in the case of $Pmin \geq 60$ μm, $Wmax \geq 1.2 \times Wmin$, in the case of $Pmin < 60$ μm, $Wmax \geq 1.5 \times Wmin$. (4)

In any one of the above-stated configurations, it is preferable that assuming that the numbers of the trunk conductive wirings and the dummy inner leads that are disposed along one side of the semiconductor chip are N and n, respectively and the number of the dummy inner leads connected with one of the trunk conductive wirings via the branch wiring is A, the trunk conductive wirings and the dummy inner leads are provided so that the relationship of the following equation (5) can be established:

$$A = n/N.$$ (5)

In any one of the above-stated configurations, it is preferable that assuming that a minimum wiring pitch and a maximum wiring pitch of all conductive wirings at a portion of the inner leads including the dummy inner leads disposed along one side of the semiconductor chip are Pmin and Pmax, respectively, the conductive wirings are formed so that the relationship of the following inequalities (6) can be established:

in the case of $Pmin \leq 30$ μm, $Pmax \geq 3.0 \times Pmin$, in the case of $30$ μm$< Pmin \leq 60$ μm, $Pmax \geq 2.0 \times Pmin$, in the case of $Pmin > 60$ μm, $Pmax > 1.0 \times Pmin$. (6)

A semiconductor device of the present invention includes the wiring board having any one of the above-stated configurations and a semiconductor chip mounted on the wiring board. Electrode pads of the semiconductor chip may be connected with the inner leads via the bump electrodes.

The following describes embodiments of the present invention in detail, with reference to the drawings.

Embodiment 1

FIG. 1 is a plan view of a wiring board of Embodiment 1. Reference numeral 1 denotes a flexible insulating base. A semiconductor chip 2 on the insulating base 1 and electrode pads 3 provided at the semiconductor chip 2 are shown with broken lines. At a region on the insulating base 1 where the semiconductor chip 2 is to be mounted, a plurality of inner leads 4 are provided. The inner leads 4 are a part of conductive wirings provided on the insulating base 1, and the other ends of the inner leads form external terminals (not illustrated). At end portions of the inner leads 4, bump electrodes 5 are provided respectively. The bump electrodes 5 are disposed so as to face the electrode pads 3 of the semiconductor chip 2 respectively. Incidentally, the left side of FIG. 1 corresponds to the input side, and the right side corresponds to the output side.

Dummy inner leads 6 are disposed at a space of the inner leads 4 on the input side so as to be aligned with the inner leads 4. The dummy inner leads 6 have a shape and a pitch corresponding to those of the inner leads 4. In other words, the dummy inner leads 6 are formed to have at least substantially the same dimensions as those of the inner leads 4. A dummy inner lead 6 is provided with a dummy bump electrode 7 corresponding to the bump electrode 5. Although the number of the inner leads 4 on the input side is less than that on the output side, the dummy inner leads 6 disposed allow the arrangement of the inner leads 4 on the input side in combination with the dummy inner leads 6, i.e., the arrangement of the bump electrodes 5 in combination with the dummy bump electrodes 7, to have a uniform pitch as a whole that is comparable to that on the output side.

Unlike the inner leads 4, the dummy inner leads 6 are not formed as a part of the complete conductive wirings having external terminals, and a portion corresponding to the inner leads 4 only is formed. In order to form the dummy bump electrodes 7 by electroplating, however, the dummy inner leads 6 have to be connected with an electric current feeding line. Herein, there is no need to connect the dummy inner leads 6 with external terminals individually, and the arrangement efficiency of the wirings will be degraded if all of the dummy inner leads 6 are extended to the feeding line. Thus, one trunk conductive wiring 8 is provided for a group of one or an adjacent plurality of dummy inner leads 6, and a branch wiring 9 branching off from the trunk conductive wiring 8 is connected with the respective dummy inner leads 6 belonging to the corresponding group. The connection of the trunk conductive wiring 8 with the feeding line allows electric power to be supplied to all of the dummy inner leads 6.

In this way, according to the present embodiment, even when electrode pads of a semiconductor chip are arranged sparsely in some portions and densely in other portions, inner leads and bump electrodes at a region corresponding to the sparsely arranged electrode pads can be arranged with substantially the same pitch as that of a region corresponding to the densely arranged electrode pads. Thereby, the stress concentration on inner leads during the packaging of a semiconductor chip, resulting from the sparse arrangement of the bump electrodes, can be alleviated, thus suppressing breakage of the inner leads.

Embodiment 2

Figure 2:
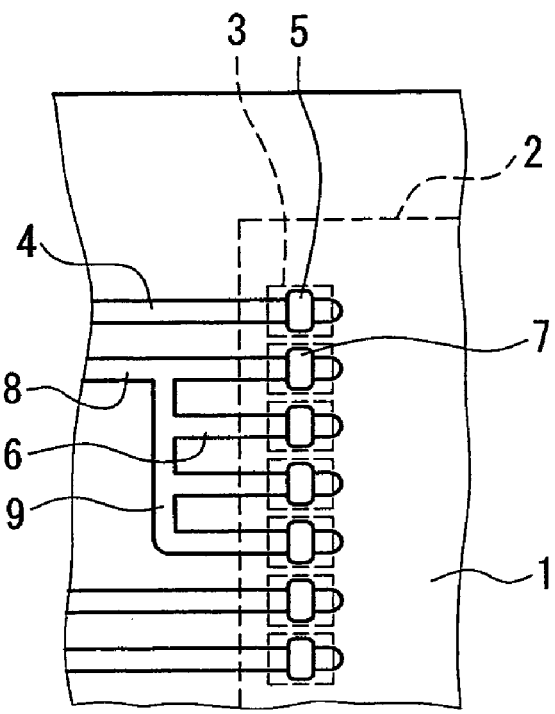
FIG. 2 is a plan view of a wiring board to be compared for explaining the effects of a wiring board of Embodiment 2.

FIG. 2 is a plan view for explaining a problem to be solved in Embodiment 2. In this drawing, the same reference numerals are assigned to the same elements as those of FIG. 1. In a wiring board of FIG. 2, inner leads 4, dummy inner leads 6, a trunk conductive wiring 8 and a branch wiring 9 all are formed with a uniform pitch and the same wiring width. Thereby, the stress concentration on the inner leads during the packaging of a semiconductor chip as described in Embodiment 1 can be alleviated, and the effect of suppressing breakage of the inner leads can be obtained moderately.

In this configuration, however, the height of dummy bump electrodes 7 formed at the dummy inner leads 6 tends to be lower than that of bump electrodes 5 formed at the inner leads 4. This is because a current density fed to the dummy inner leads 6 is lower than a current density fed to the inner leads 4 during an electroplating step for forming the bump electrodes. That is, although a conductive wiring extending from an inner lead 4 and a trunk conductive wiring 8 have the same wiring width, the conductive wiring feeds electricity to one inner lead 4, whereas the trunk conductive wiring 8 feeds electricity to a plurality of (four in FIG. 2) dummy inner leads 6. When the heights of the bump electrodes vary due to a difference in heights of the bump electrodes 5 and the dummy bump electrodes 7, stress may be concentrated on a part of the bump electrodes 5 during the packaging of a semiconductor chip, thus causing breakage of the inner leads 4 or poor bonding between the electrode pads and the bump electrodes 5.

Figure 3:
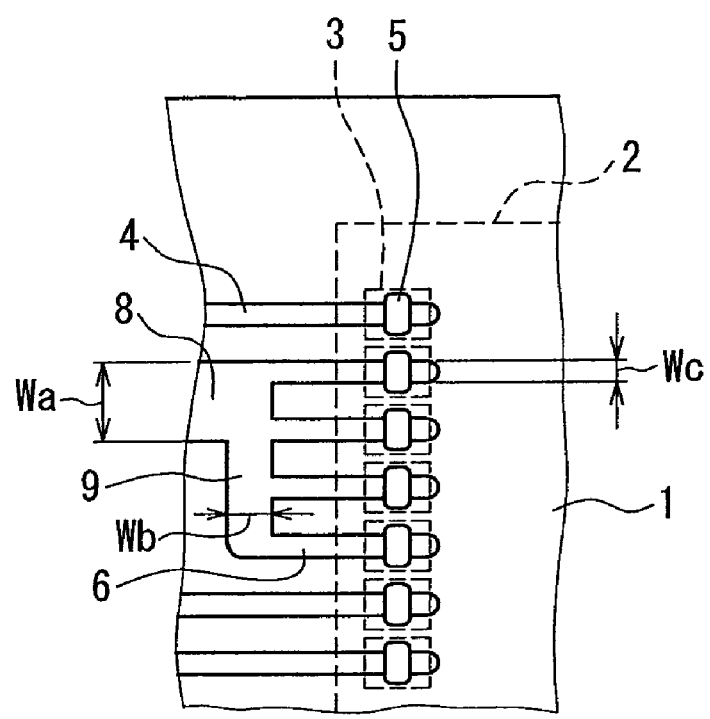
FIG. 3 is a plan view for explaining the configuration of wiring boards of Embodiments 2 and 3.

Thus, in the wiring board of the present embodiment, a wiring width Wa of the trunk conductive wiring 8 may be adjusted in accordance with the number n of the dummy inner leads 6 branching off therefrom as shown in FIG. 3.

More specifically, the dimensions of the respective portions may be set so that the wiring width Wa of a trunk conductive wiring 8, the number n of the dummy inner leads 6 connected with the trunk conductive wiring 8 and a wiring width Wc of a dummy inner lead 6 can establish the relationship of the following inequalities (1):

$$Wa \geq Wc \times n/4$$

where Wa>Wc. (1)

Thereby, a difference in density of the currents fed to the dummy inner leads 6 and the inner leads 4 during electroplating can be reduced, so that a difference in height between the dummy bump electrodes 7 and the bump electrodes 5 can be reduced to a level adequate for practical applications.

Embodiment 3

Referring again to FIG. 3, a wiring board of Embodiment 3 will be described below. In Embodiment 2, the wiring width Wa of the trunk conductive wiring 8 is adjusted in accordance with the number n of the branching dummy inner leads 6, and thereby a difference in density of the currents fed to the dummy inner leads 6 and the inner leads 4 can be reduced. In some cases, however, the density of the current fed to the dummy inner leads 6 cannot be improved sufficiently due to the influences of a wiring width Wb of the branch wiring 9. That is, although the electricity feeding ability is improved by increasing the wiring width Wa of the trunk conductive wiring 8, the current density may be limited in some cases because the wiring width Wb of the branch wiring 9 is not sufficiently commensurate with such electricity feeding ability. In order to avoid such a state, the wiring width Wb of the branch wiring 9 is adjusted as follows in the present embodiment.

That is, the dimensions of the respective portions may be set so that the wiring width Wb of a branch wiring, the number n of the dummy inner leads 6 connected with the branch wiring and a wiring width Wc of a dummy inner lead 6 can establish the relationship of the following inequalities (2):

$$Wb \geq Wc \times n/3$$

where Wb>Wc. (2)

Thereby, a difference in density of the currents fed to the dummy inner leads 6 and the inner leads 4 during electroplating can be reduced sufficiently without limiting the electricity feeding ability of the trunk conductive wiring 8, so that a difference in height between the dummy bump electrodes 7 and the bump electrodes 5 can be reduced to a level adequate for practical applications.

Note here that when the wiring width Wb of the branch wiring 9 is adjusted as stated above, the relationship with the wiring width Wa of the trunk conductive wiring preferably is adjusted as follows.

That is, the dimensions of the respective portions may be set so that the wiring width Wa of a trunk conductive wiring 8, the wiring width Wb of a branch wiring 9 branching off from the trunk conductive wiring 8 and a wiring width Wc of a dummy inner lead 6 connected with the branch wiring 9 can establish the relationship of the following inequality (3):

$$Wa > Wb \geq Wc. \quad (3)$$

Thereby, the wiring width Wb of the branch wiring 9 can be set within an effective range of minimized waste in terms of the relationship with the wiring width Wa of the trunk conductive wiring 8.

Embodiment 4

Figure 4:
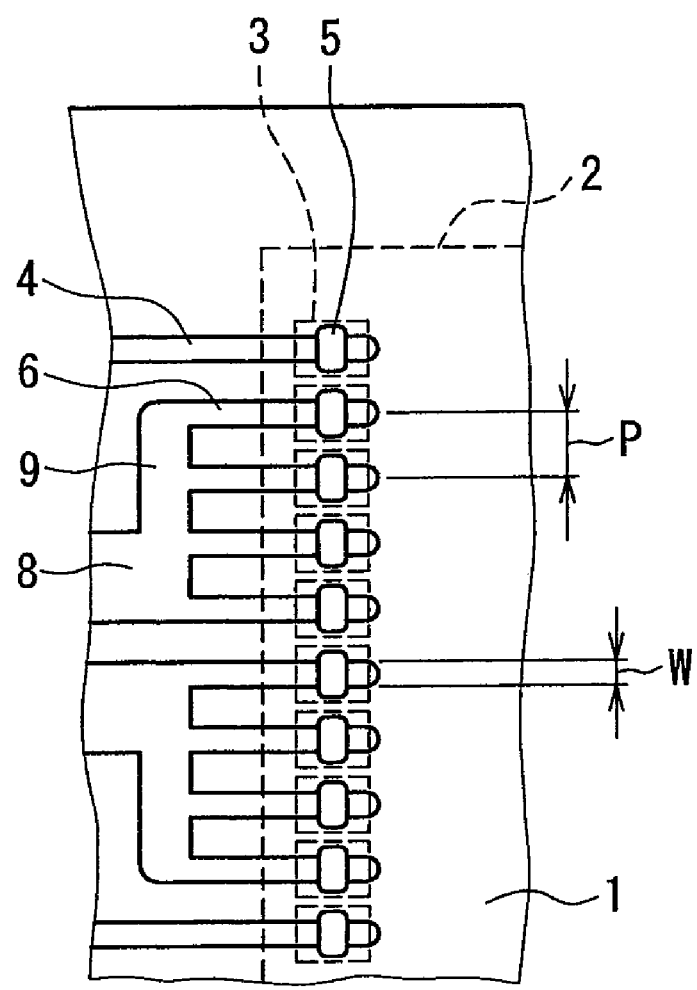
FIG. 4 is a plan view for explaining the configuration of wiring boards of Embodiments 4 and 5.
Figure 5:
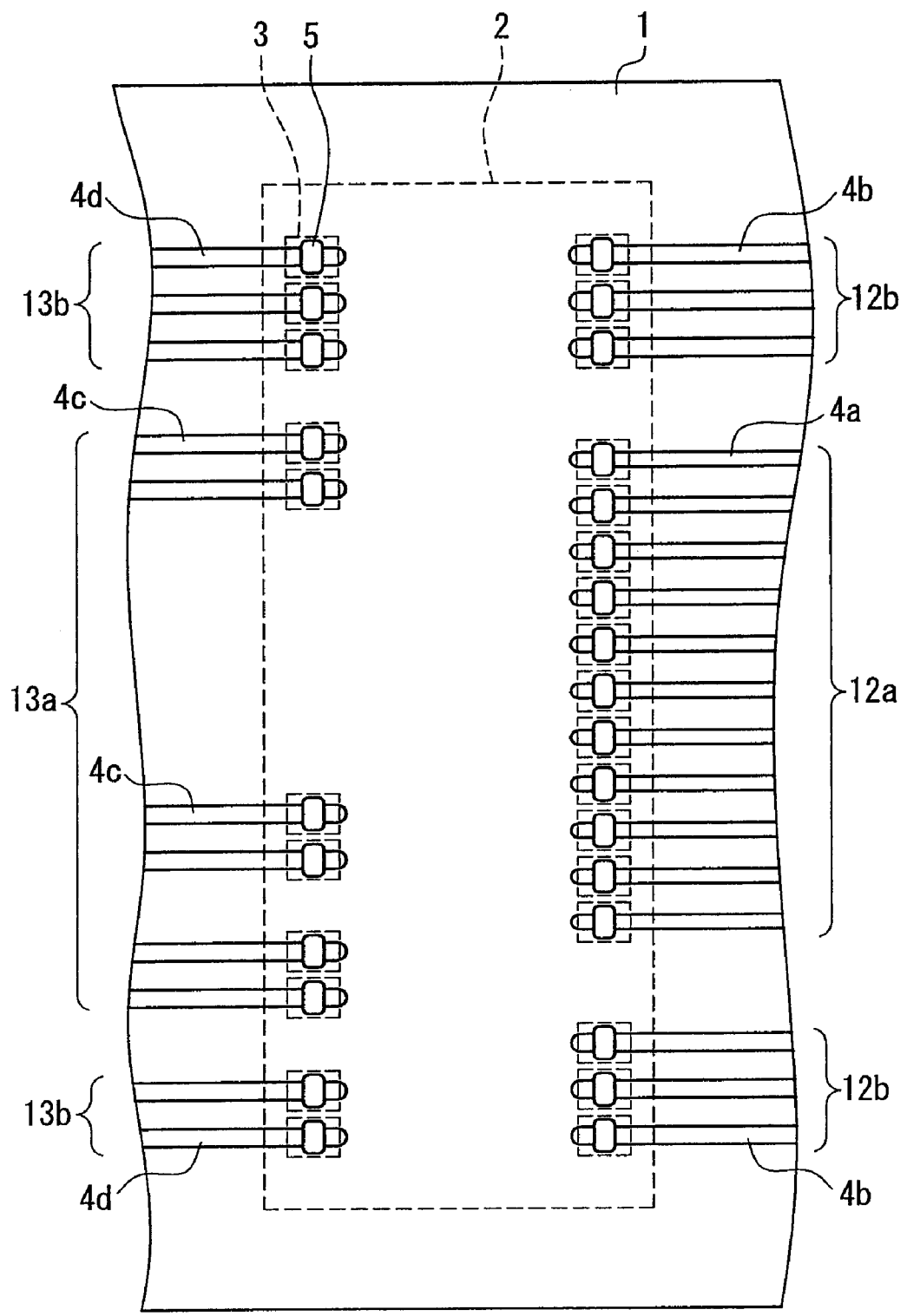
FIG. 5 is a plan view of a conventional wiring board.
Figure 6:
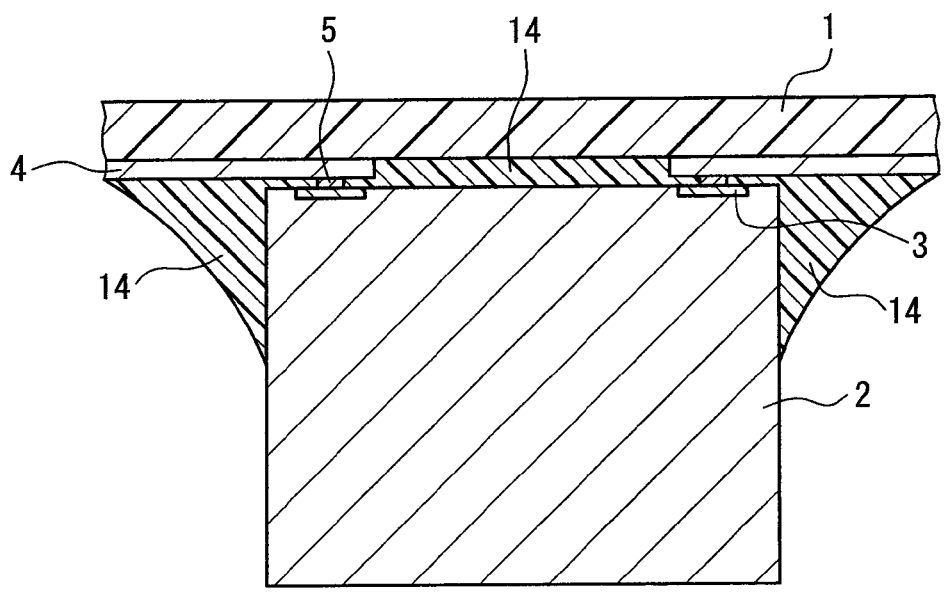
FIG. 6 is a cross-sectional view of the wiring board on which a semiconductor chip is packaged.
Figure 7:
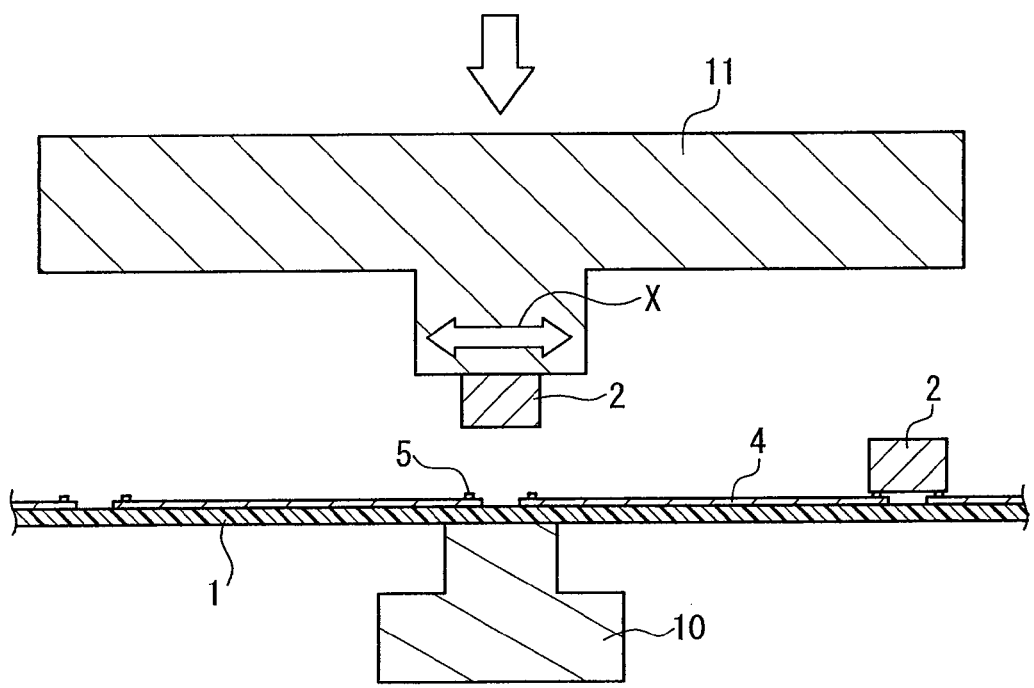
FIG. 7 is a cross-sectional view showing a bonding process where a semiconductor chip is packaged on a wiring board.

Referring now to FIG. 4, a wiring board of Embodiment 4 will be described below. It is desirable that uniform bump electrodes be formed at inner leads 4 and dummy inner leads 6 and a wiring width W and a pitch P of the arrangement be uniform in order to prevent a break due to the concentration of stress during the packaging of a semiconductor chip. However, considering relationships with other conditions, it may not be always possible or appropriate to make them totally uniform. Thus, in the present embodiment, the pitch P of the arrangement and the wiring width W are specified as follows.

That is, assuming that the minimum wiring width, the maximum wiring width and the minimum pitch of the inner leads 4 and the dummy inner leads 6 that are disposed along one side of a semiconductor chip are Wmin, Wmax and Pmin, respectively, the dimensions of the respective portions may be set so that the relationship of the following inequalities (4) can be established:

in the case of $Pmin \geq 60$ μm, $Wmax \geq 1.2 \times Wmin$, in the case of $Pmin < 60$ μm, $Wmax \geq 1.5 \times Wmin$. (4)

Thereby, even when electrode pads of a semiconductor chip are arranged sparsely in some portions and densely in other portions, inner leads and bump electrodes at a region corresponding to the sparsely arranged electrode pads can be arranged with substantially the same pitch as that of a region corresponding to the densely arranged electrode pads. Thereby, the stress concentration on inner leads during the packaging of a semiconductor chip, resulting from the sparse arrangement of the bump electrodes, can be alleviated, thus suppressing a break in the inner leads.

Herein, in order to make the wiring width and the arrangement pitch of the inner leads 4 and the dummy inner leads 6 uniform to be adequate for practical applications as stated above, it is preferable that the number of the dummy inner leads 6 branching off from one trunk conductive wiring 8 be adjusted as follows.

That is, assuming that the numbers of the trunk conductive wirings 8 and the dummy inner leads 6 that are disposed along one side of a semiconductor chip are N and n, respectively and the number of the dummy inner leads 6 connected with one trunk conductive wiring 8 via a branch wiring 9 is A, they may be set so that the relationship of the following equation (5) can be established:

$$A = n/N. \quad (5)$$

Thereby, the wiring width and the arrangement pitch of the inner leads 4 and the dummy inner leads 6 easily can be made uniform sufficiently for practical applications.

Embodiment 5

Referring again to FIG. 4, a wiring board of Embodiment 5 will be described below. As stated above, it is desirable that uniform bump electrodes be formed at inner leads 4 and dummy inner leads 6 and a pitch P of the arrangement be uniform in order to prevent a break due to the concentration of stress during the packaging of a semiconductor chip. However, considering relationships with other conditions, it may not be always possible or appropriate to make them totally uniform. Thus, in the present embodiment, the pitch P of the arrangement is specified as follows.

That is, assuming that the minimum wiring pitch and the maximum wiring pitch of the inner leads 4 and the dummy inner leads 6 that are disposed along one side of a semiconductor chip are Pmin and Pmax, respectively, the wiring pitch may be set so that the relationship of the following inequalities (6) can be established:

in the case of $Pmin \leq 30$ μm, $Pmax \geq 3.0 \times Pmin$, in the case of $30$ μm $< Pmin \leq 60$ μm, $Pmax \geq 2.0 \times Pmin$, in the case of $Pmin > 60$ μm, $Pmax > 1.0 \times Pmin$. (6)

Thereby, the wiring width and the arrangement pitch of the inner leads 4 and the dummy inner leads 6 easily can be made uniform to be adequate for practical applications.

The above-described embodiments are configured so that, apart from conductive wirings extending from the inner leads 4, the independent trunk conductive wirings 8 are provided for connection with the dummy inner leads 6, and electricity is fed to the dummy inner leads 6 during electroplating via the trunk conductive wirings 8. Instead, they may be configured so that a conductive wiring extending from an inner lead 4 branches off as a trunk conductive wiring and electricity is fed to the inner leads 4 and the dummy inner leads 6 from a common trunk conductive wiring during electroplating.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board, comprising:
   a flexible insulating base;
   a plurality of conductive wirings arranged on the insulating base, end portions of the conductive wirings defining inner leads at a chip mounting region where a semiconductor chip is to be mounted; and
   bump electrodes that are provided respectively at the inner leads of the conductive wirings,
   wherein the inner leads are arranged so as to form a sparsely arranged region and a densely arranged region along at least one side of the chip mounting region and have a first shape and pitch in the densely arranged region, and
   the wiring board further comprises:
   dummy inner leads provided in the sparsely arranged region and having the first shape and pitch of the inner leads and aligned with the inner leads, the dummy inner leads being provided with dummy bump electrodes corresponding to the bump electrodes;
   branch wirings connected respectively to an adjacent plurality of the dummy inner leads; and
   a trunk conductive wiring connected to a group of the adjacent plurality of the dummy inner leads via the branch wirings.

2. The wiring board according to claim 1, wherein a wiring width Wa of the trunk conductive wiring, the number n of the dummy inner leads connected with the trunk conductive wiring and a wiring width Wc of the dummy inner leads establish the relationship of the following inequalities (1):

$$Wa \geq Wc \times n/4$$

where Wa>Wc. (1)

3. The wiring board according to claim 1, wherein a wiring width Wb of the branch wiring, the number n of the dummy inner leads connected with the branch wiring and a wiring width Wc of the dummy inner leads establish the relationship of the following inequalities (2):

$$Wb \geq Wc \times n/3$$

where Wb>Wc. (2)

4. The wiring board according to claim 1, wherein a wiring width Wa of the trunk conductive wiring, a wiring width Wb of the branch wiring branching off from the trunk conductive wiring and a wiring width Wc of the dummy inner leads connected with the branch wiring establish the relationship of the following inequality (3):

$$Wa > Wb \geq Wc.$$ (3)

5. The wiring board according to claim 1, wherein assuming that a minimum wiring width, a maximum wiring width and a minimum pitch of the inner leads and the dummy inner leads that are disposed along one side of the semiconductor chip are Wmin, Wmax and Pmin, respectively, dimensions thereof are set so that the relationship of the following inequalities (4) can be established:

in the case of $Pmin \geq 60$ μm, $Wmax \geq 1.2 \times Wmin$, in the case of $Pmin < 60$ μm, $Wmax \geq 1.5 \times Wmin$. (4)

6. The wiring board according to claim 1, wherein assuming that the numbers of the trunk conductive wirings and the dummy inner leads that are disposed along one side of the semiconductor chip are N and n, respectively and the number of the dummy inner leads connected with one of the trunk conductive wirings via the branch wiring is A, the trunk conductive wirings and the dummy inner leads are provided so that the relationship of the following equation (5) can be established:

$$A = n/N.$$ (5)

7. The wiring board according to claim 1, wherein assuming that a minimum wiring pitch and a maximum wiring pitch of all conductive wirings at a portion of the inner leads including the dummy inner leads disposed along one side of the semiconductor chip are Pmin and Pmax, respectively, the conductive wirings are formed so that the relationship of the following inequalities (6) can be established:

in the case of $Pmin \leq 30$ μm, $Pmax \geq 3.0 \times Pmin$, in the case of $30$ μm$< Pmin \leq 60$ μm, $Pmax \geq 2.0 \times Pmin$, in the case of $Pmin > 60$ μm, $Pmax > 1.0 \times Pmin$. (6)

8. A semiconductor device, comprising the wiring board according to claim 1 and a semiconductor chip mounted on the wiring board, wherein electrode pads of the semiconductor chip are connected with the inner leads via the bump electrodes.

* * * * *